(12) United States Patent
Matsuura

(10) Patent No.: US 7,633,107 B2
(45) Date of Patent: Dec. 15, 2009

(54) SEMICONDUCTOR DEVICE AND MANUFACTURING METHOD THEREOF

(75) Inventor: Osamu Matsuura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 259 days.

(21) Appl. No.: 11/505,417

(22) Filed: Aug. 17, 2006

(65) Prior Publication Data
US 2007/0228511 A1    Oct. 4, 2007

(30) Foreign Application Priority Data
Mar. 31, 2006    (JP) .............................. 2006-100723

(51) Int. Cl.
  *H01L 27/108*    (2006.01)
(52) U.S. Cl. ...................... 257/295; 257/532
(58) Field of Classification Search ................. 257/295, 257/532
  See application file for complete search history.

(56) References Cited

U.S. PATENT DOCUMENTS

2002/0024074 A1 *  2/2002  Jung et al. .................. 257/295
2002/0117700 A1 *  8/2002  Fox ............................ 257/295

FOREIGN PATENT DOCUMENTS

JP    2002324894 A    11/2002
JP    2003-174095 A    6/2003

OTHER PUBLICATIONS

Office Action dated Jul. 30, 2007, issued in corresponding Korean application No. 10-2006-0075142.

* cited by examiner

*Primary Examiner*—Zandra Smith
*Assistant Examiner*—Paul E Patton
(74) *Attorney, Agent, or Firm*—Westerman, Hattori, Daniels & Adrian, LLP

(57) ABSTRACT

On forming a ferroelectric capacitor structure, an $IrO_2$ film and an $IrO_x$ film which are constituents of an upper electrode layer are sequentially formed on a capacitor film. By RTA treatment at 600° C. to 750° C., in this case, at 725° C. for about one minute under an $O_2$ atmosphere, only a surface layer of the $IrO_x$ film is oxidized, and a highly oxidized layer which is higher in oxidation degree as compared with the other portion of the $IrO_x$ film is formed.

6 Claims, 13 Drawing Sheets

COMPARISON OF FIRST LAYER AND SECOND LAYER UPPER ELECTRODE

COMPARISON OF BEFORE AND AFTER ANNEALING OF FIRST LAYER UPPER ELECTRODE

COMPARISON OF BEFORE AND AFTER ANNEALING OF SECOND LAYER UPPER ELECTRODE

US 7,633,107 B2

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2006-100723, filed on Mar. 31, 2006, the entire contents of which are incorporated herein by reference.

BACKGROUND OF THE INVENTION

1. Field of the Invention

The present invention relates to a semiconductor device having a capacitor structure formed by sandwiching a capacitor film composed of a dielectric material between a lower electrode and an upper electrode, and is particularly preferable for application to a ferroelectric capacitor structure in which a capacitor film is composed of a ferroelectric material.

2. Description of the Related Art

In recent years, development of a ferroelectric memory (FeRAM: Ferro-electric Random Access Memory) that holds information in a ferroelectric capacitor structure by using polarization inversion of ferroelectrics has been pursued. A ferroelectric memory especially attracts attention because it is a nonvolatile memory which does not lose information held therein even when the power supply is cut off, and realization of high integration density, high-speed drive, high durability and low power consumption can be expected from it.

A ferroelectric capacitor structure is easily deteriorated in its characteristics by an external hydrogen gas and water. It is also easily deteriorated in its characteristics by etching processing or the like. Therefore, restoration of capacitor characteristics by high temperature annealing is essential. Thus, as the materials of the upper electrodes and the lower electrodes constructing the ferroelectric capacitor structures, noble metals and noble metal oxides capable of resisting high temperature annealing are frequently used as disclosed in, for example, Japanese Patent Application Laid-open No. 2003-174095. As the material of the upper electrodes, an iridium oxide which is a conductive oxide is promising for suppression of the characteristics degradation.

In a ferroelectric capacitor structures, the following two functions are required of the upper electrode in addition to the original role as the capacitor electrode.

(1) The function of forming a favorable interface between a capacitor film and the upper electrode, and obtaining excellent ferroelectric characteristics.

(2) The function of preventing deterioration of the ferroelectric characteristics of the ferroelectric capacitor structure as the manufacturing process advances.

As for the function of (1), an iridium oxide (first iridium oxide film) with high oxidation degree which is more crystallized is formed on the capacitor film. By the first iridium oxide film, excellent ferroelectric characteristics can be obtained.

As for the function of (2), the first iridium oxide film is not preferable as an upper layer in the respect that it is inferior in morphology though it has the above described function, and therefore, an iridium oxide (second iridium oxide film) which is lower in oxidation degree as compared with the first iridium oxide and is not completely crystallized is formed in the upper layer of the first oxide iridium film. The second oxide iridium film is formed into a uniform film excellent in morphology, and therefore, it can suppress degradation of ferroelectric characteristics.

Accordingly, as the upper electrode of the ferroelectric capacitor structure, it is desirable to form it into a construction including a stacked structure of the first iridium oxide film and the second iridium oxide film.

However, when the second iridium film of the upper layer is formed of an iridium oxide in the amorphous state, the iridium oxide is being reduced as the manufacturing process advances though it is formed into a uniform film excellent in morphology at the beginning of film formation. Thereby, a number of voids occur inside thereof, and it becomes an iridium oxide with sparse density, in a so-called porous state. As a result, hydrogen diffusion is promoted through the voids in the second iridium oxide film, and further reduction of the iridium oxide and degradation of the ferroelectric characteristics are promoted.

SUMMARY OF THE INVENTION

The present invention is made in view of the above described problems, and has an object to provide a semiconductor device with high reliability capable of securing characteristics to a high degree as a result of suppressing reduction of an oxide iridium to prevent it from becoming porous though the iridium oxide is adopted as a material of an upper electrode of a capacitor structure.

A semiconductor device of the present invention includes a semiconductor substrate, and a capacitor structure which is formed above the above described semiconductor substrate, and is formed by sandwiching a capacitor film composed of a dielectric material by a lower electrode and an upper electrode, the upper electrode has an iridium oxide film, and a surface layer of the iridium oxide film is made a highly oxidized layer higher in oxidation degree of iridium than a portion directly below the surface layer.

A manufacturing method of a semiconductor device of the present invention is a manufacturing method of a semiconductor device including a capacitor structure formed above a semiconductor substrate by sandwiching a capacitor film composed of a dielectric material by a lower electrode and an upper electrode includes the steps of on forming the upper electrode, forming an iridium oxide film, and forming, on a surface layer of the iridium oxide film, a highly oxidized layer higher in oxidation degree of iridium than a portion directly below the surface layer by heat-treating the iridium oxide film under an oxidizing atmosphere.

DETAILED DESCRIPTION OF THE PREFERRED EMBODIMENTS

Basic Gist of the Present Invention

The present inventor has conceived the present invention as a result of earnest study on the composition of strengthening reduction resistance of the second iridium oxide itself though the second iridium oxide film is formed into an amorphous state with a low oxidation degree as compared with the first iridium oxide film, regarding the second iridium oxide film which is formed on the first iridium oxide film crystallized into the composition of $IrO_2$.

In the present invention, the second iridium oxide film is required to be the film excellent in reduction resistance in addition to being the uniform film excellent in morphology. These two requirements seem to be in the contradicting relation, but in order to meet the latter requirement, it is sufficient that the surface layer of the second iridium oxide film shows strong reduction resistance. Thus, in the present invention, the second iridium oxide film is formed into the amorphous state with a low oxidation degree as compared with the first iridium oxide film, and thereafter, only the surface layer is brought into the state strong in the reduction resistance, namely, into the highly oxidized layer with high oxidation. Specifically, only the surface layer is made the highly oxidized layer by heat-treating (annealing treatment) the second iridium oxide film at a proper temperature (600° C. to 750° C.) in an oxidizing atmosphere ($O_2$ atmosphere in this case), for example, by rapid annealing (RTA). Here, at the treatment temperature lower than 600° C., sufficiently high oxidation degree of the surface layer cannot be obtained, and at the treatment temperature higher than 750° C., an adverse effect on the capacitor film or the like cannot be ignored.

Figure 1A:
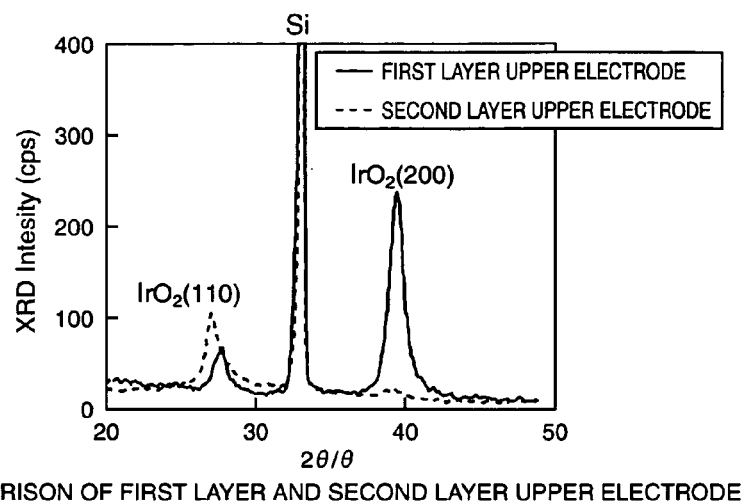
FIG. 1A to 1C are characteristic charts showing results of forming a first and a second iridium oxide films and examining their compositions by an X-ray diffractometer (XRD)
Figure 1B:
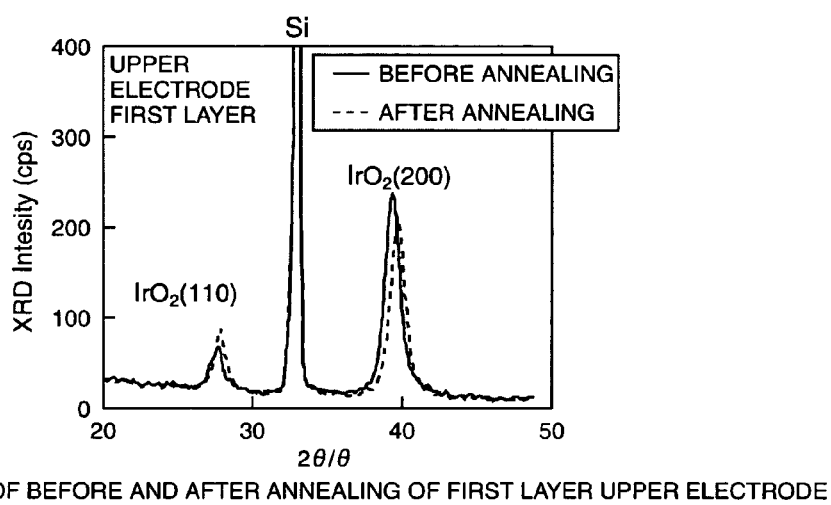
Figure 1C:
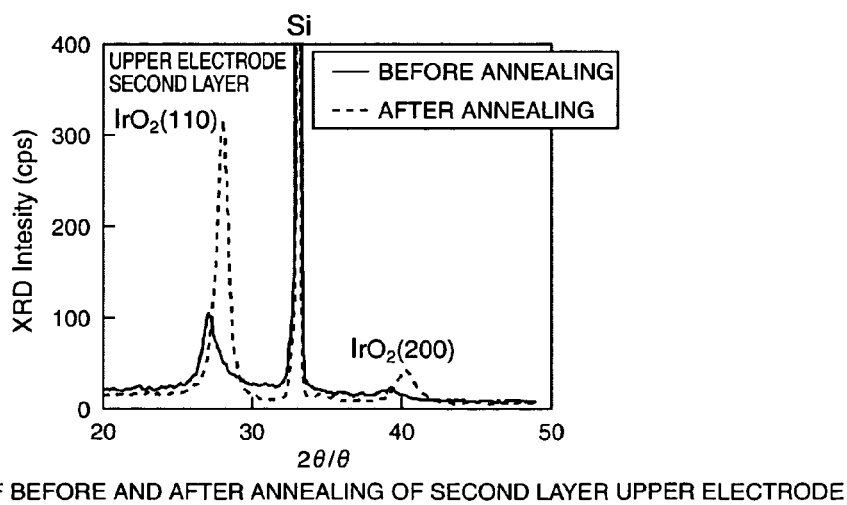

The result of actually forming the first and the second iridium oxide films, and examining the compositions by the X-ray diffractometer (XRD) is shown in FIGS. 1A to 1C.

Comparison of the first iridium oxide film and the second iridium oxide film is shown in FIG. 1A, and XRD patterns comparing the first and the second iridium oxide films before and after annealing are shown in FIGS. 1B and 1C, respectively. The iridium oxides were deposited on the silicon oxide films, and XRD measurement was performed before and after annealing, respectively.

As a result, the second iridium oxide is lower in peak intensity of $IrO_2$ (200) and is a little higher in peak intensity of $IrO_2$ (110) as compared with the first iridium oxide.

Next, the first and the second iridium oxide films were compared in the XRD patterns before and after annealing. As a result, the first iridium oxide film did not change by annealing, but the second iridium oxide film increased in peak intensities of both of Ir (110) and Ir (200).

Accordingly, the second iridium oxide film, which remarkably increases in the peak intensities of Ir (110) and Ir (200) after annealing, advances in crystallization by annealing, and therefore, it is low in oxidation degree with respect to Ir after deposition. On the other hand, since the first iridium oxide film does not change in the peak intensities of Ir (110) and Ir (200) before and after annealing, it is completely crystallized after deposition, and can be said to be high in oxidation degree with respect to Ir after deposition. Since the second iridium oxide film advances in oxidation degree by annealing, the area in the vicinity of the front surface especially advances in crystallization, and the iridium oxide of the surface layer more advances in crystallization as compared with the inside and can be said to be high in oxidation degree.

By the construction of the present invention, a semiconductor memory with high reliability which can satisfy both excellent morphology and high oxidation resistance which are required of an upper layer constructing an upper electrode, and is capable of securing characteristics to a high degree as a result of suppressing reduction of an iridium oxide to prevent it from becoming porous though adopting the iridium oxide as a material of the upper electrode to prevent characteristics degradation is realized.

Concrete Embodiments to which the Present Invention is Applied

Hereinafter, concrete embodiments to which the present invention is applied will be described in detail with reference to the drawings. In the following embodiments, the case where the present invention is applied to a FeRAM is shown as an example, but the present invention is also applicable to a semiconductor memory using an ordinary dielectric film for a capacitor structure.

First Embodiment

In this embodiment, a so-called planar type FeRAM in which continuity of a lower electrode and an upper electrode of a ferroelectric capacitor structure is obtained above the ferroelectric capacitor structure is shown as an example. For convenience of explanation, the structure of the FeRAM will be described with its manufacturing method.

FIGS. 2A to 7B are schematic sectional views showing the construction of the FeRAM according to a first embodiment with its manufacturing method in sequence of the process steps.

Figure 2A:
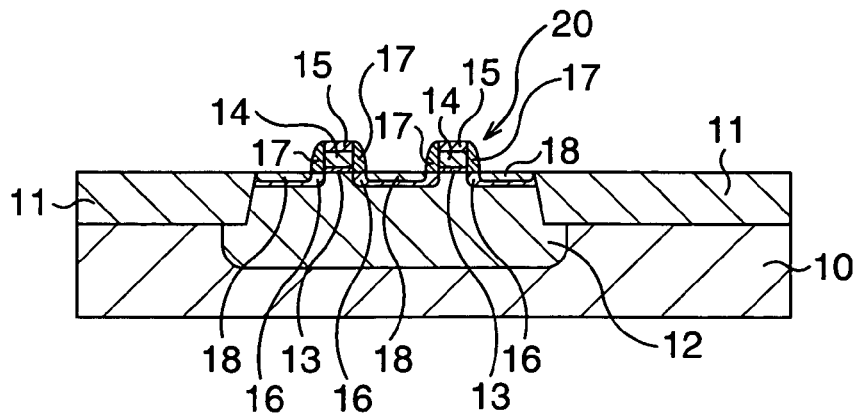
FIGS. 2A to 2D are schematic sectional views showing construction of a FeRAM according to a first embodiment with its manufacturing method in sequence of process steps.

First, as shown in FIG. 2A, an MOS transistor 20 which functions as a selection transistor is formed on a silicon semiconductor substrate 10.

In detail, an element isolation structure 11 is formed on a surface layer of the silicon semiconductor substrate 10 by, for example, an STI (Shallow Trench Isolation) method, and an element active region is defined.

Next, an impurity, in this case, B is ion-implanted into the element active region under the condition of, for example, a doze amount of $3.0 \times 10^{13}/cm^2$ and acceleration energy of 300 keV, and a well 12 is formed.

Next, a thin gate insulating film 13 with a film thickness of about 3.0 nm is formed in the element active region by thermal oxidation or the like, then, a polycrystalline silicon film of a film thickness of about 180 nm and, for example, a silicon nitride film of a film thickness of about 29 nm are deposited on the gate insulating film 13 by a CVD method, and the silicon nitride film, the polycrystalline silicon film and the gate insulating film 13 are processed into the shape of an electrode by lithography and subsequent dry etching, whereby a gate electrode 14 is pattern-formed on the gate insulating film 13. At this time, a cap film 15 composed of a silicon nitride film is pattern-formed on the gate electrode 14 at the same time.

Next, with the cap film 15 as a mask, an impurity, in this case, As is ion-implanted into the element active region under the condition of, for example, a doze amount of $5.0 \times 10^{14}/cm^2$, and acceleration energy of 10 keV, and a so-called LDD region 16 is formed.

Next, for example, a silicon oxide film is deposited on the entire surface by a CVD method, and by performing so-called etchback of the silicon oxide film, a side wall insulating film 17 is formed by leaving the silicon oxide film only on the side surfaces of the gate electrode 14 and the cap film 15.

Next, with the cap film 15 and the side wall insulating film 17 as a mask, an impurity, in this case, P is ion-implanted into the element active region under the condition that the impurity concentration becomes higher than the LDD region 16, a source/drain region 18 which is overlapped on the LDD region 16 is formed, and an MOS transistor 20 is completed.

Figure 2B:
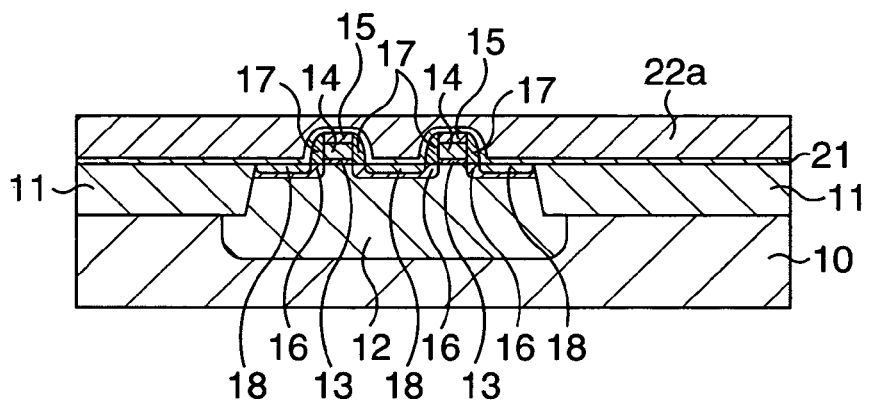

Subsequently, as shown in FIG. 2B, a protection film 21 of the MOS transistor 20 and an interlayer insulating film 22a are sequentially formed.

In detail, the protection film 21 and the interlayer insulating film 22a are sequentially deposited to cover the MOS transistor 20. In this case, as the protection film 21, a silicon oxide film is used as a material, and is deposited to a film thickness of about 20 nm by a CVD method. As the interlayer insulating film 22a, a stacked structure in which, for example, a plasma SiO film (film thickness of about 20 nm), a plasma SiN film (film thickness of about 80 nm) and a plasma TEOS film (film thickness of about 1000 nm) are sequentially deposited is formed, and after stacking them, the stacked structure is polished to a film thickness of about 700 nm by CMP.

Figure 2C:
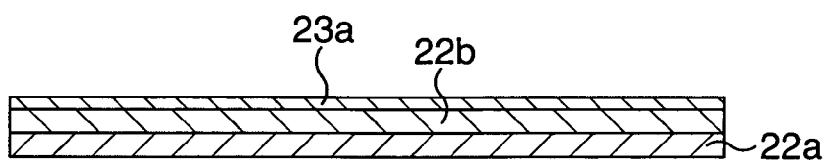

Subsequently, as shown in FIG. 2C, an interlayer insulating film 22b and a protection film 23 are sequentially formed. In FIG. 2C and the drawings following it, only the construction of an upper part from the interlayer insulating film 22a is shown, and the silicon semiconductor substrate 10, the MOS transistor 20 and the like are omitted in the drawings for convenience of illustration.

In detail, a silicon oxide film is first deposited on the interlayer insulating film 22a to a film thickness of about 100 nm by a plasma CVD method using, for example, TEOS, and the interlayer insulating film 22b is formed. Thereafter, the interlayer insulating film 22b is subjected to annealing treatment. As the condition of this annealing treatment, it is carried out at, for example, 650° C. for 20 to 45 minutes while an $N_2$ gas is supplied at a flow rate of 20 liter/minute.

Next, the protection film 23 for preventing entry of hydrogen/water to a ferroelectric film of a ferroelectric capacitor structure that will be described layer is formed on the interlayer insulating film 22b. As the protection film 23, alumina ($Al_2O_3$) is used as a material, and is deposited to a film thickness of about 20 nm to 50 nm by a sputtering method. Thereafter, the protection film 23 is subjected to annealing treatment. As the condition of the annealing treatment, it is carried out at, for example, 650° C. for 30 seconds to 120 seconds while an $O_2$ gas is supplied at a flow rate of 2 liters/minute.

Figure 2D:
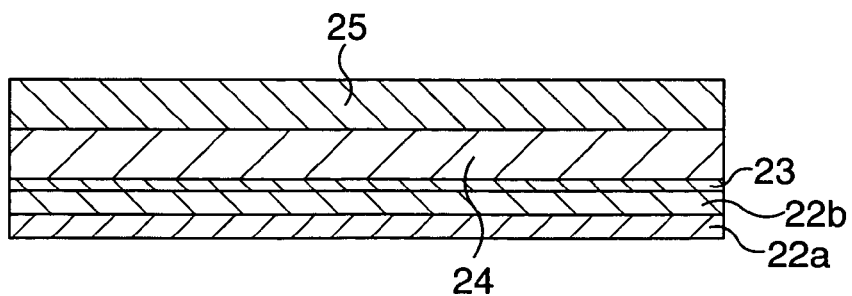

Subsequently, as shown in FIG. 2D, a lower electrode layer 24 and a capacitor film 25 are sequentially formed.

In detail, Ir is first deposited to a film thickness of, for example, about 100 nm by a sputtering method, and the lower electrode layer 24 is formed.

Next, by an MOCVD method, for example, $PbZr_{1-x}Ti_xO_3$ (0<x<1) (PZT) that is a ferroelectric is deposited to a film thickness of about 5 nm on the lower electrode layer 24, PZT is deposited to a film thickness of about 115 successively thereon by an MOCVD method, and thereby, the capacitor film 25 is formed. The substrate temperature at the time of forming the capacitor film 25 is set at 620° C., and the pressure is set at about $6.7 \times 10^2$ Pa (5 Torr). As the material of the capacitor film 25, $Pb_{1-x}La_xZr_{1-y}Ti_yO_3$ (0<x<1, 0<y<1), $SrBi_2(Ta_xNb_{1-x})_2O_9$ (0<x<1), $Bi_4Ti_3O_{12}$ and the like may be used instead of PZT.

Figure 3A:
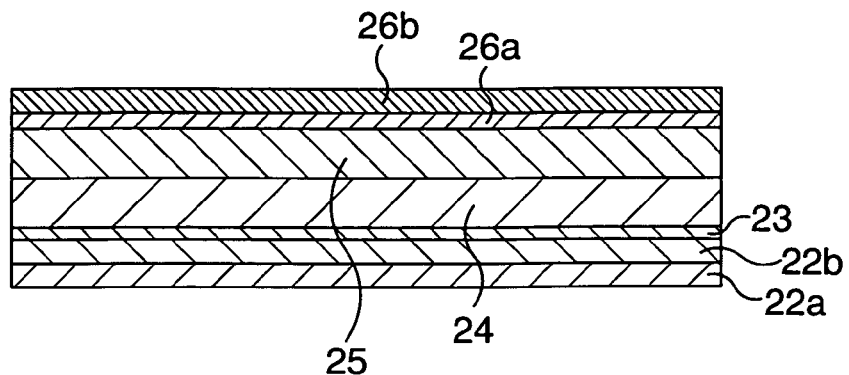
FIGS. 3A to 3C are schematic sectional views showing the construction of the FeRAM according to the first embodiment with its manufacturing method in sequence of the process steps.

Subsequently, as shown in FIG. 3A, an $IrO_2$ film 26a and an $IrO_x$ film 26b which are constituents of an upper electrode layer 26 are sequentially formed on the capacitor film 25.

In detail, by a sputtering method with the substrate temperature regulated at 100° C. to 300° C., in this case, at 300° C., an iridium oxide which is a conductive oxide is first formed to a film thickness of 30 nm to 70 nm, in this case, about 50 nm. By performing sputter deposition at the substrate temperature, an $IrO_2$ film 26a which is formed by being crystallized into the composition of $IrO_2$ is formed. By the $IrO_2$ film 26a, a favorable interface is formed between the $IrO_x$ film 26b and the capacitor film 25, and excellent ferroelectric characteristics are obtained.

Next, by a sputtering method with the substrate temperature regulated at 20° C. to 100° C., which is a lower temperature than at the time of deposition of the $IrO_2$ film 26a, in this case, at 30° C., an iridium oxide that is a conductive oxide is formed to a film thickness of 50 nm to 200 nm, which is thicker than the $IrO_2$ film 26a, in this case, about 100 nm. By performing sputter deposition at this substrate temperature, the $IrO_x$ film 26b of an amorphous state ($IrO_x$: 0<x<2) lower in oxidation degree than $IrO_2$ film 26a is formed. The $IrO_x$ film 26b is formed into a uniform film excellent in morphology, and therefore, it can suppress degradation of the ferroelectric characteristics.

Figure 3B:
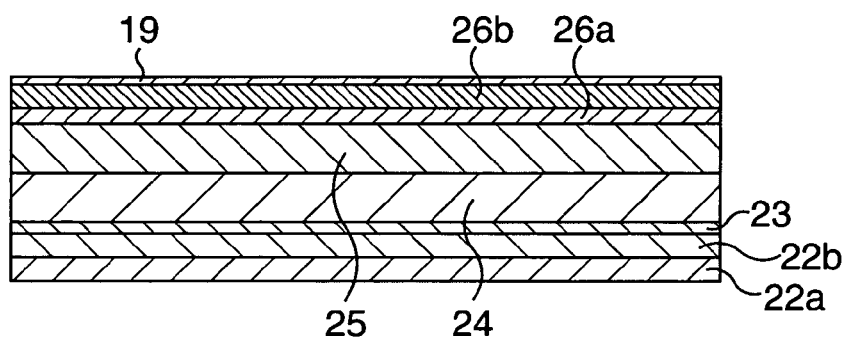

Subsequently, as shown in FIG. 3B, the surface layer of the $IrO_x$ film 26b is subjected to annealing treatment.

In detail, by RTA treatment at 600° C. to 750° C., in this case, at 725° C. for about one minute under an $O_2$ atmosphere, only the surface layer of the $IrO_x$ film 26b is oxidized, and a highly oxidized layer 19 of a thickness of about 30 nm, which is higher in oxidation degree as compared with the other portion of the $IrO_x$ film 26b, is formed. By the presence of the highly oxidized layer 19 on the surface layer of the $IrO_x$ film 26b, reduction of the $IrO_x$ film 26b is suppressed even if it goes through the subsequent process steps, and the $IrO_x$ film 26b is prevented from becoming porous.

Figure 3C:
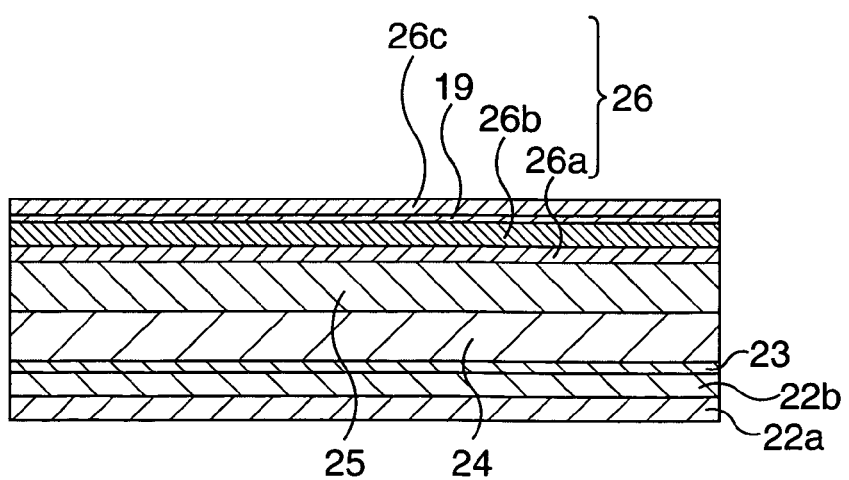

Subsequently, as shown in FIG. 3C, a noble metal film, which functions as a cap film for the $IrO_x$ film 26b, in this case, an Ir film 26c is formed to a film thickness of about 50 nm on the highly oxidized layer 19 by a sputtering method. The upper electrode layer 26 is composed of the $IrO_2$ film 26a, the $IrO_x$ film 26b (including the highly oxidized layer 19 on the surface layer), and the Ir film 26c. It is possible to omit formation of the Ir film 26c.

Figure 4A:
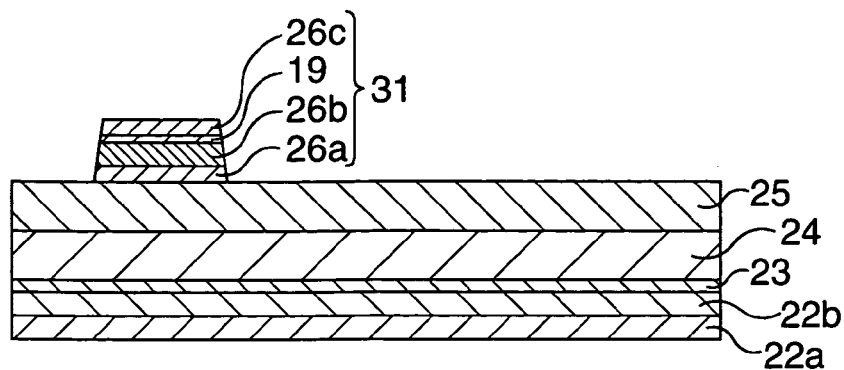
FIGS. 4A to 4D are schematic sectional views showing the construction of the FeRAM according to the first embodiment with its manufacturing method in sequence of the process steps.

Subsequently, as shown in FIG. 4A, an upper electrode 31 is pattern-formed.

In detail, the upper electrode layer 26 is processed into a plurality of electrode shapes by lithography and subsequent dry etching to pattern-form the upper electrodes 31.

Figure 4B:
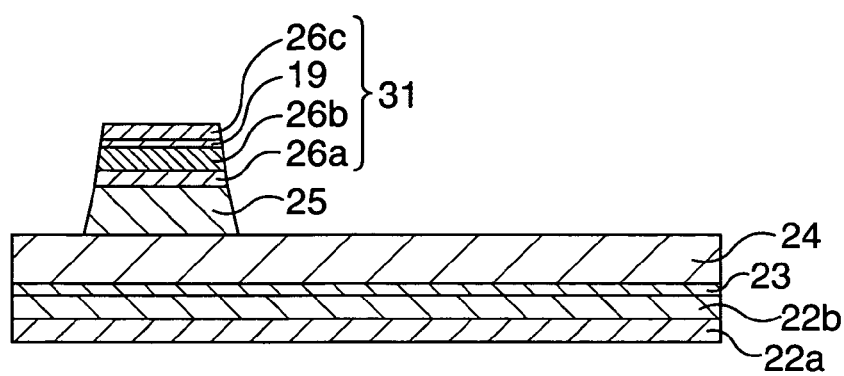

Subsequently, as shown in FIG. 4B, the capacitor film 25 is processed.

In detail, the capacitor film 25 is matched with the upper electrode 31, and is processed by lithography and subsequent dry etching. After the patterning of the capacitor film 25, the capacitor film 25 is subjected to annealing treatment to restore the function of the capacitor film 25.

Figure 4C:
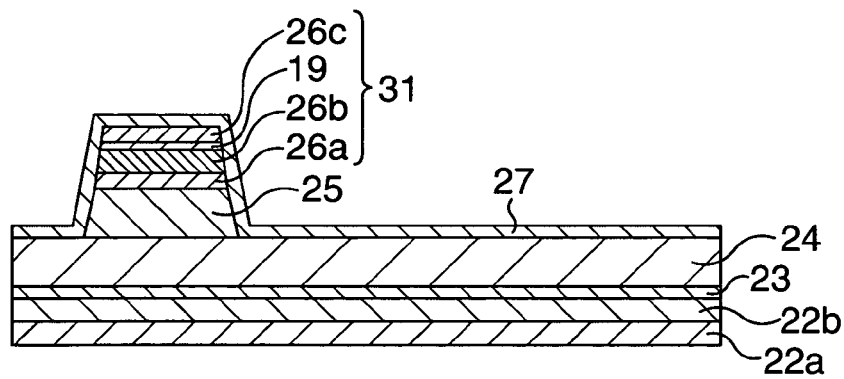

Subsequently, as shown in FIG. 4C, a protection film 27 for preventing entry of hydrogen/water into the capacitor film 25 is formed.

In detail, alumina ($Al_2O_3$) is used as a material, and is deposited to a film thickness of about 50 nm by the sputtering method on the lower electrode layer 24 so as to cover the capacitor film 25 and the upper electrode 31 to form the protection film 27. Thereafter, the protection film 27 is subjected to annealing treatment.

Figure 4D:
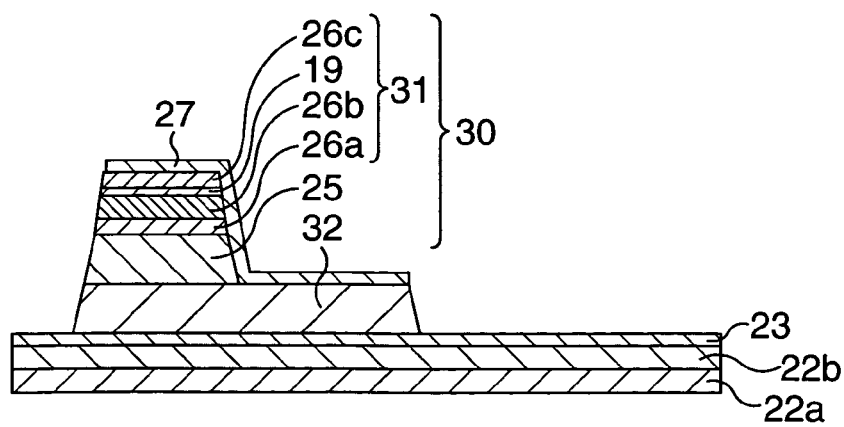

Subsequently, as shown in FIG. 4D, the lower electrode layer 24 as well as the protection film 27 is processed, and the ferroelectric capacitor structure 30 is completed.

In detail, the protection film 27 and the lower electrode layer 24 are matched with the processed capacitor film 25, and are processed by lithography and the subsequent dry etching so that the lower electrode layer 24 remains in a larger size than the capacitor film 25, and a lower electrode 32 is pattern-formed. Thereby, the ferroelectric capacitor structure 30 in which the capacitor film 25 and the upper electrode 31 are sequentially stacked on the lower electrode 32, and the lower electrode 32 and the upper electrode 31 are capacitively coupled via the capacitor film 25 is completed. At this time, the protection film 27 remains at the same time on the top surface of the upper electrode, the side surfaces of the upper electrode 31 and the capacitor film 25 and the top surface of the lower electrode layer 24 to cover them. Thereafter, the protection film 27 is subjected to annealing treatment.

Figure 5A:
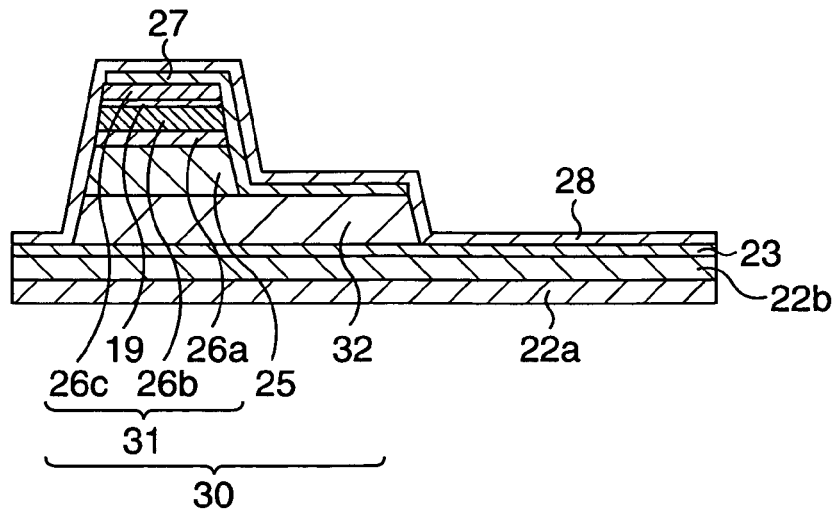
FIGS. 5A to 5C are schematic sectional views showing the construction of the FeRAM according to the first embodiment with its manufacturing method in sequence of the process steps.

Subsequently, as shown in FIG. 5A, a protection film 28 is formed.

In detail, alumina ($Al_2O_3$) is used as a material, and is deposited to a film thickness of about 20 nm to 50 nm by a sputtering method to cover the entire surface of the ferroelectric capacitor structure 30 to form the protection film 28. Thereafter, the protection film 28 is subjected to annealing treatment.

Figure 5B:
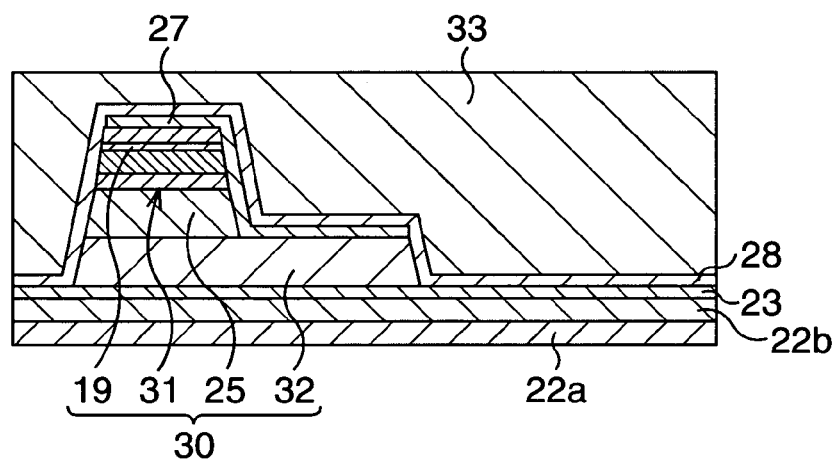

Subsequently, as shown in FIG. 5B, an interlayer insulating film 33 is deposited.

In detail, the interlayer insulating film 33 is formed so as to cover the ferroelectric capacitor structure 30 via the protection films 27 and 28. In this case, the interlayer insulating film 33 is formed by depositing a silicon oxide film to a film thickness of about 1500 nm to 2500 nm by a plasma CVD method using, for example, TEOS, and thereafter, polishing it until the film thickness becomes about 1000 nm, for example, by CMP. After the CMP, plasma annealing treatment of $N_2O$, for example, is performed for the purpose of dehydration of the interlayer insulating film 33.

Figure 5C:
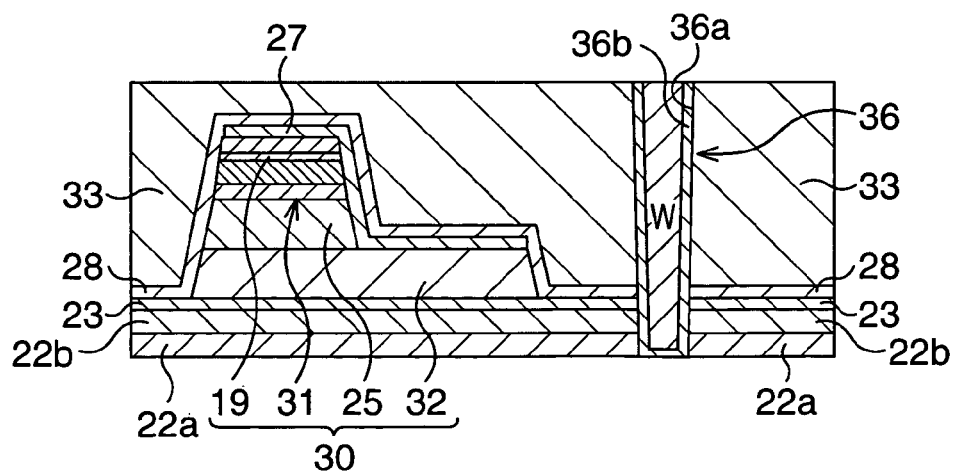

Subsequently, as shown in FIG. 5C, a plug 36 connected to the source/drain region 18 of the transistor structure 20 is formed.

In detail, with the source/drain region 18 as an etching stopper, the interlayer insulating film 33, the protection films 28 and 27, the interlayer insulating films 22b and 22a, and the protection film 21 are processed by lithography and subsequent dry etching until a part of the front surface of the source/drain region 18 is exposed, and a via hole 36a with a diameter of about 0.3 µm, for example, is formed.

Next, for example, a Ti film and a TiN film are sequentially deposited to a film thickness of about 20 nm and a film thickness of about 50 nm by a sputtering method so as to cover the wall surface of the via hole 36a, and a base film (glue film) 36b is formed. Then, for example, a W film is formed to fill the via hole 36a via the glue film 36b by a CVD method. Thereafter, the W film and the glue film 36b are polished with the interlayer insulating film 33 as a stopper by CMP, and a plug 36 in which the via hole 36a is filled with W via the glue film 36b is formed. After the CMP, plasma annealing treatment of $N_2O$, for example, is performed.

Figure 6A:
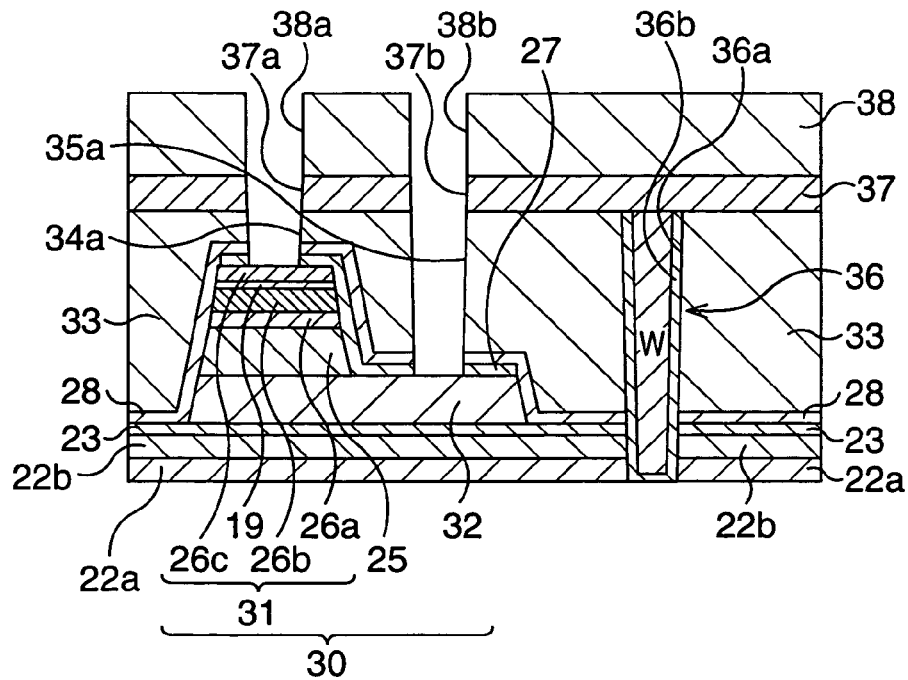
FIGS. 6A to 6C are schematic sectional views showing the construction of the FeRAM according to the first embodiment with its manufacturing method in sequence of the process steps.

Subsequently, as shown in FIG. 6A, after a hard mask 37 and a resist mask 38 are formed, via holes 34a and 35a to the ferroelectric capacitor structure 30 are formed.

In detail, first, a silicon nitride film is deposited to a film thickness of about 100 nm on the interlayer insulating film 33 by a CVD method, and the hard mask 37 is formed. Next, a resist is coated on the hard mask 37, the resist is processed by lithography, and the resist mask 38 having openings 38a and 38b is formed.

Next, the hard mask 37 is dry-etched by using the resist mask 38, and openings 37a and 37b are formed in the regions of the hard mask 37, which match the openings 38a and 38b.

Then, by mainly using the hard mask 37, with the upper electrode 31 and the lower electrode 32 respectively as etching stoppers, the interlayer insulating film 33 and the protection films 28 and 27 are dry-etched. In the dry-etching, the processing which is applied to the interlayer insulating film 33 and the protection films 28 and 27 until a part of the front surface of the upper electrode 31 is exposed, and the processing which is applied to the interlayer insulating film 33 and the protection films 28 and 27 until a part of the front surface of the lower electrode 32 is exposed are carried out at the same time, and the via holes 34a and 35a each with a diameter of about 0.5 µm, for example, are formed at the respective regions at the same time.

Figure 6B:
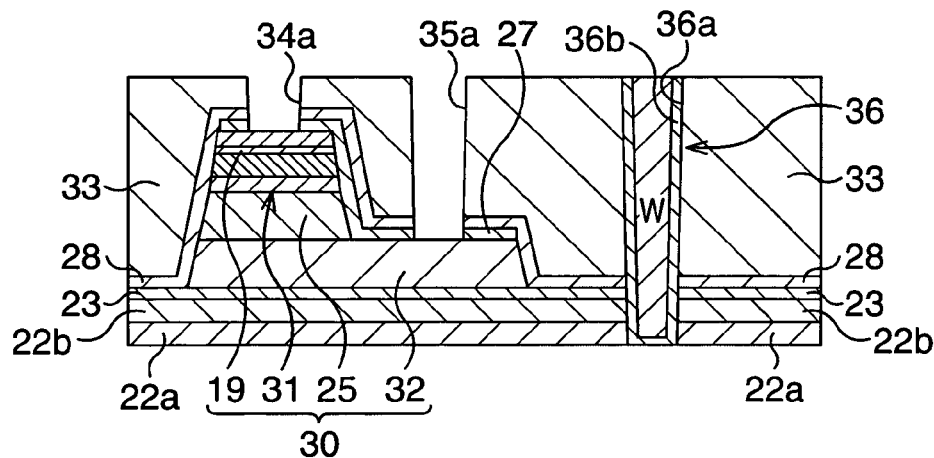

Subsequently, as shown in FIG. 6B, the resist mask 38 and the hard mask 37 are removed.

In detail, first, the remaining resist mask 38 is removed by ashing treatment or the like. Thereafter, annealing treatment is performed to repair the damage which the ferroelectric capacitor structure 30 suffers due to the various process steps after formation of the ferroelectric capacitor structure 30. Then, by overall anisotropic etching, so-called etchback, the hard mask 37 is removed.

Figure 6C:
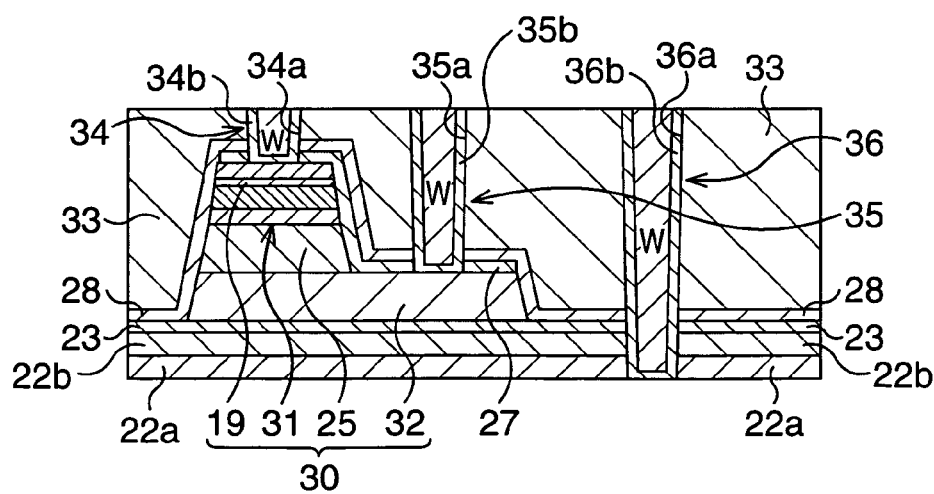

Subsequently, as shown in FIG. 6C, plugs 34 and 35 connected to the ferroelectric capacitor structure 30 are formed.

In detail, first, base films (glue films) 34b and 35b are formed to cover the wall surfaces of the via holes 34a and 35a, and thereafter, W films are formed by a CVD method to fill the via holes 34a and 35a via the glue films 34b and 35b. Then, with the interlayer insulating film 33 as a stopper, for example, the W films and the glue films 34b and 35b are polished by CMP, and the plugs 34 and 35 in which the insides of the via holes 34a and 35a are filled with the W via the glue films 34b and 35b are formed. After the CMP, plasma annealing treatment of $N_2O$, for example, is performed.

Figure 7A:
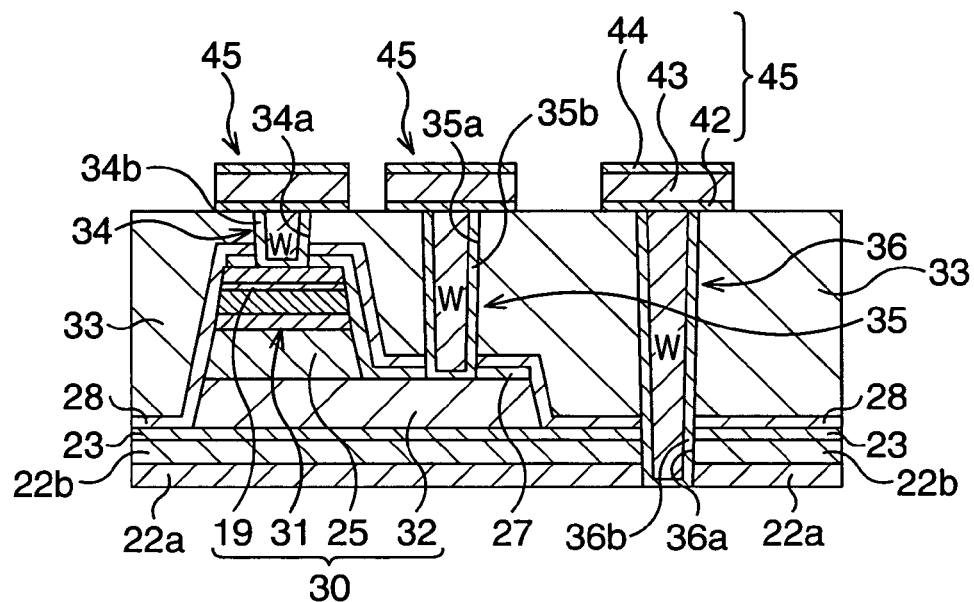
FIGS. 7A and 7B are schematic sectional views showing the construction of the FeRAM according to the first embodiment with its manufacturing method in sequence of the process steps.

Subsequently, as shown in FIG. 7A, first wirings 45 which are respectively connected to the plugs 34, 35 and 36 are formed.

In detail, first, a barrier metal film 42, a wiring film 43 and a barrier metal film 44 are deposited on the entire surface on the interlayer insulating film 33 by a sputtering method or the like. As the barrier metal film 42, for example, a Ti film of a film thickness of about 5 nm and a TiN film of a film thickness of about 150 nm are deposited to be stacked by a sputtering method. As the wiring film 43, for example, an Al alloy film (Al—Cu film in this case) is deposited to a film thickness of about 350 nm. As the barrier metal film 44, for example, a Ti film of a film thickness of about 5 nm and a TiN film of a film thickness of about 150 nm are deposited to be stacked by a sputtering method. In this case, the structure of the wiring film 43 is made the same structure as the logic portion of the same rule other than FeRAM, and therefore, there is no problem in processing of the wirings and reliability.

Next, after, for example, an SiON film or an anti-reflection film (not shown) are deposited as an anti-reflection film, the anti-reflection film, the barrier metal film 44, the wiring film 43 and the barrier metal film 42 are processed into the wiring shape by lithography and subsequent dry etching, and the first wirings 45 respectively connected to the plugs 34, 35 and 36 are pattern-formed. As the wiring film 43, a Cu film (or a Cu alloy film) is formed by utilizing a so-called damascene method or the like instead of forming the Al alloy film, and a Cu wiring may be formed as the first wiring 45.

Figure 7B:
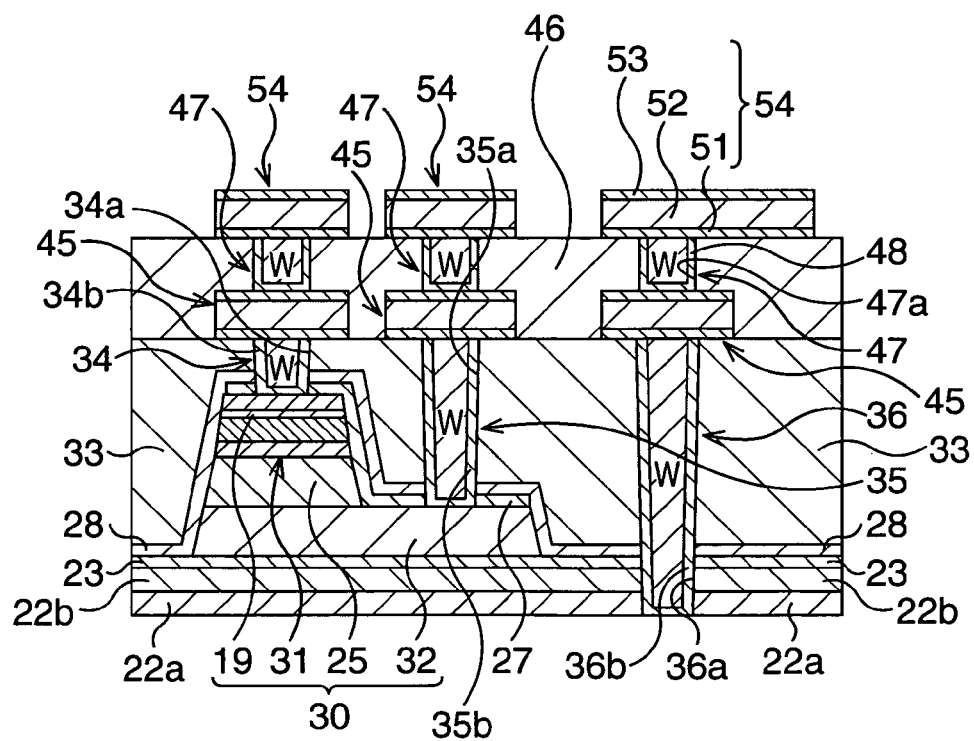

Subsequently, as shown in FIG. 7B, second wirings 54 which are connected to the first wirings 45 are formed.

In detail, first, an interlayer insulating film 46 is formed to cover the first wirings 45. As the interlayer insulating film 46, a silicon oxide film is deposited to a film thickness of about 700 nm, and a plasma TEOS film is formed to make the film thickness about 1100 nm as a whole, and thereafter, the front surface is polished by CMP to form the film thickness of about 750 nm.

Next, plugs 47 which are connected to the first wirings 45 are formed.

First, via holes 47a of a diameter of about 0.25 μm, for example, are formed by processing the interlayer insulating film 46 by lithography and subsequent dry etching until parts of the front surfaces of the first wirings 45 are exposed.

Next, after base films (glue films) 48 are formed to cover the wall surfaces of the via holes 47a, W films are formed to fill the via holes 47a via the glue films 48 by a CVD method. Then, for example, the W films and the glue films 48 are polished with the interlayer insulating film 46 as a stopper, the plugs 47 in which the insides of the via holes 47a are filled with the W films via the glue films 48 are formed.

Next, second wirings 54 which are connected to the plugs 47 respectively are formed.

First, a barrier metal film 51, a wiring film 52 and a barrier metal film 53 are deposited on the entire surface by a sputtering method or the like. As the barrier metal film 51, for example, a Ti film of a film thickness of about 5 mm and a TiN film of a film thickness of about 150 nm are deposited to be stacked by a sputtering method. As the wiring film 52, for example, an Al alloy film (Al—Cu film in this case) is deposited to a film thickness of about 350 nm. As the barrier metal 53, for example, a Ti film of a film thickness of about 5 nm and a TiN film of a film thickness of about 150 nm are deposited to be stacked by a sputtering method. In this case, the structure of the wiring film 52 is made the same structure as the logic portion of the same rule other than FeRAM, and therefore, there is no problem in processing of the wirings and reliability.

Next, after, for example, an SiON film or an anti-reflection film (not shown) are deposited as an anti-reflection film, the anti-reflection film, the barrier metal film 53, the wiring film 52 and the barrier metal film 51 are processed into the wiring shapes by lithography and subsequent dry etching, and the second wirings 54 are pattern-formed. As the wiring film 52, a Cu film (or a Cu alloy film) is formed by utilizing a so-called damascene method or the like instead of forming the Al alloy film, and Cu wirings may be formed as the second wirings 54.

Thereafter, the planar type FeRAM according to this embodiment is completed through the various process steps of forming interlayer insulating films, additional upper layer wirings and the like.

As described above, according to this embodiment, though the iridium oxide of the upper electrode 31 of the ferroelectric capacitor structure 30 is made the stacked structure of the $IrO_2$ film 26a and the $IrO_x$ film 26b to prevent characteristics degradation, reduction of the $IrO_x$ film 26b is suppressed to prevent it from becoming porous by forming the highly oxidized layer 19 on the surface layer of the $IrO_x$ film 26b. By this construction, the planar type FeRAM with high reliability which is capable of securing characteristics to a high degree can be realized.

Second Embodiment

In this embodiment, a so-called stack type FeRAM in which continuity of a lower electrode of a ferroelectric capacitor structure is obtained below the ferroelectric capacitor structure and continuity of an upper electrode is obtained above the ferroelectric capacitor structure is shown as an example. For the convenience of explanation, a structure of the FeRAM is described with its manufacturing method.

FIGS. 8A to 13B are schematic sectional views showing a construction of the FeRAM according to the second embodiment with its manufacturing method in sequence of the process steps.

Figure 8A:
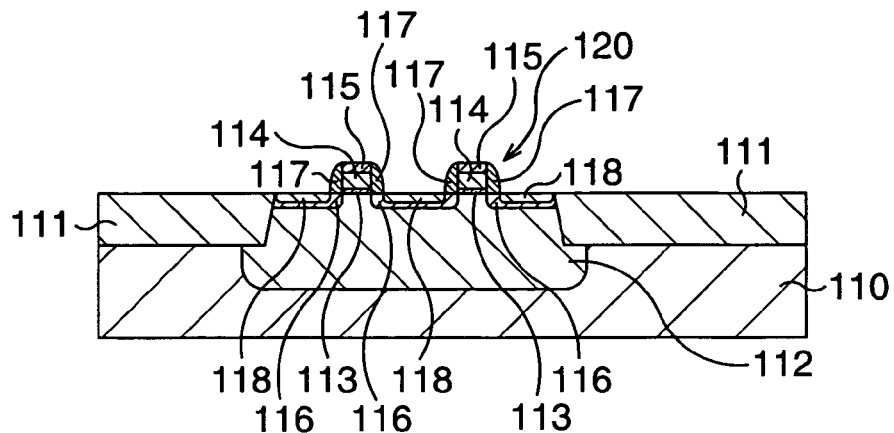
FIGS. 8A to 8D are schematic sectional views showing a construction of a FeRAM according to a second embodiment with its manufacturing method in sequence of process steps.

First, as shown in FIG. 8A, a MOS transistor 120 which functions as a selection transistor is formed on a silicon semiconductor substrate 110.

In detail, an element isolation structure 111 is formed on a surface layer of the silicon semiconductor substrate 110 by, for example, an STI (Shallow Trench Isolation) method, and an element active region is defined.

Next, an impurity, in this case, B is ion-implanted into the element active region under the condition of, for example, a doze amount of $3.0 \times 10^{13}/cm^2$ and acceleration energy of 300 keV, and thereby, a well 112 is formed.

Next, a thin gate insulating film 113 with a film thickness of about 3.0 nm is formed in the element active region by thermal oxidation or the like, then, a polycrystalline silicon film of a film thickness of about 180 nm and, for example, a silicon nitride film of a film thickness of about 29 nm are deposited on the gate insulating film 113 by a CVD method, and the silicon nitride film, the polycrystalline silicon film and the gate insulating film 113 are processed into electrode shapes by lithography and subsequent dry etching, whereby gate electrodes 114 are pattern-formed on the gate insulating film 113. At this time, cap films 115 composed of a silicon nitride film are pattern-formed on the gate electrodes 114 at the same time.

Next, with the cap films 115 as masks, an impurity, in this case, As is ion-implanted into the element active region under the condition of, for example, a doze amount of $5.0 \times 10^{14}/cm^2$, and acceleration energy of 10 keV, and a so-called LDD region 116 is formed.

Next, for example, a silicon oxide film is deposited on the entire surface by a CVD method, and by performing so-called etchback of the silicon oxide film, a side wall insulating film 117 is formed by leaving the silicon oxide film only on the side surfaces of the gate electrodes 114 and the cap films 115.

Next, with the cap films 115 and the side wall insulating films 117 as masks, an impurity, in this case, P is ion-implanted into the element active region under the condition that the impurity concentration becomes higher than the LDD region 116, a source/drain region 118 which is overlapped on the LDD region 116 is formed, whereby an MOS transistor 120 is completed.

Figure 8B:
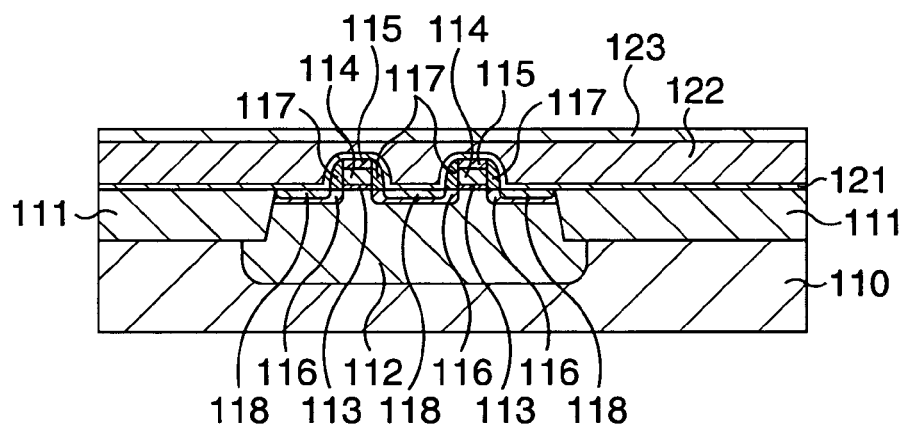

Subsequently, as shown in FIG. 8B, a protection film 121 of the MOS transistor 120, an interlayer insulating film 122 and an upper insulating film 123a are sequentially formed.

In detail, the protection film 121, the interlayer insulating film 122 and the upper insulating film 123a are sequentially formed so as to cover the MOS transistor 120. In this case, as the protection film 121, a silicon oxide film is used as a material, and is deposited to a film thickness of about 20 nm by a CVD method. As the interlayer insulating film 122, a stacked structure in which, for example, a plasma SiO film (film thickness of about 20 nm), a plasma SiN film (film thickness of about 80 nm) and a plasma TEOS film (film thickness of about 1000 nm) are sequentially deposited is formed, and after stacking them, the stacked structure is polished until the film thickness becomes about 700 nm by CMP. As the upper insulating film 123a, a silicon nitride film is used as a material, and is deposited to a film thickness of about 100 nm by a CVD method.

Figure 8C:
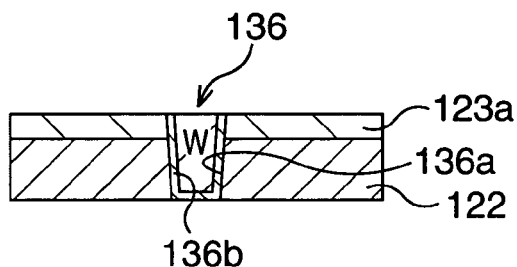

Subsequently, as shown in FIG. 8C, a plug 136 which is connected to the source/drain region 118 of the transistor structure 120 is formed. In FIG. 8C and the drawings following it, only the construction of an upper part from the interlayer insulating film 122 is shown, and the silicon semiconductor substrate 110, the MOS transistor 120 and the like are omitted in the drawings for convenience of illustration.

In detail, with the source/drain region 118 as an etching stopper, the upper insulating film 123a, the interlayer insulating film 122 and the protection films 121 are processed by lithography and subsequent dry etching until a part of the front surface of the source/drain region 118 is exposed, and a via hole 136a with a diameter of about 0.3 μm, for example, is formed.

Next, for example, a Ti film and a TiN film are sequentially deposited to a film thickness of about 20 nm and a film thickness of about 50 nm by a sputtering method so as to cover the wall surface of the via hole 136a, and a base film (glue film) 136b is formed. Then, for example, a W film is formed to fill the via hole 136a via the glue film 136b by a CVD method. Thereafter, the W film and the glue film 136b are polished with the upper insulating film 123a as a stopper by CMP, and a plug 136 in which the inside of the via hole 136a is filled with W via the glue film 136b is formed. After the CMP, plasma annealing treatment of $N_2O$, for example, is performed.

Figure 8D:
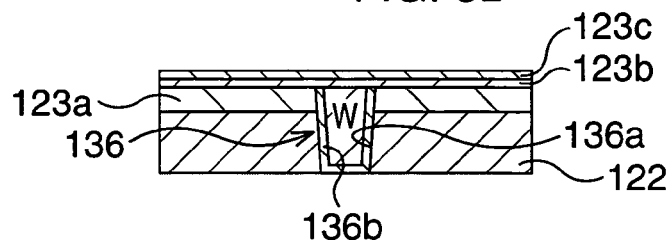

Subsequently, as shown in FIG. 8D, an orientation property improving film 123b and an oxygen barrier film 123c are sequentially formed.

In detail, in order to improve the orientation property of the ferroelectric capacitor structure, for example, Ti is first deposited to a film thickness of about 20 nm, after which, Ti is nitrided to be TiN by rapid annealing (RTA) treatment at 650° C. under an $N_2$ atmosphere, and the conductive orientation property improving film 123b is formed.

Next, for example, TiAlN is deposited to a film thickness of about 100 nm, and the conductive oxygen barrier film 123c is formed.

Figure 9A:
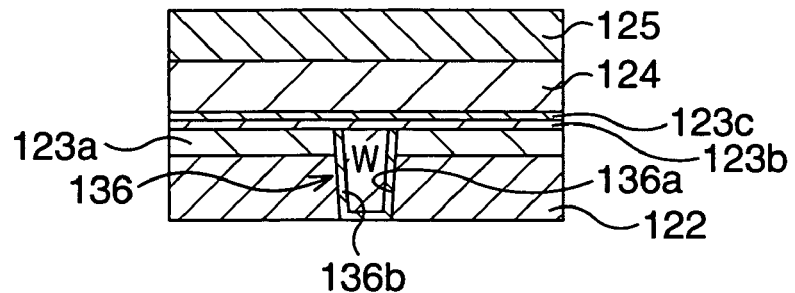
FIGS. 9A to 9D are schematic sectional views showing the construction of the FeRAM according to the second embodiment with its manufacturing method in sequence of the process steps.

Subsequently, as shown in FIG. 9A, a lower electrode layer 124 and a capacitor film 125 are sequentially formed.

In detail, Ir is first deposited to a film thickness of, for example, about 100 nm by a sputtering method, and the lower electrode layer 124 is formed.

Next, by an MOCVD method, for example, Pb(Nb, Zr, Ti)$O_3$(PZT), which is a ferroelectric, is deposited to a film thickness of about 5 nm on the lower electrode layer 124, PZT is successively deposited to a film thickness of about 115 nm thereon by the MOCVD method, and thereby, the capacitor film 125 is formed. The substrate temperature at the time of forming the capacitor film 125 is set at 620° C., and the pressure is set at about $6.7 \times 10^2$ Pa (5 Torr). As the material of the capacitor film 125, $Pb_{1-x}La_xZr_{1-y}Ti_yO_3$ (0<x<1, 0<y<1), $SrBi_2(Ta_xNb_{1-x})_2O_9$ (0<x<1), $Bi_4Ti_2O_{12}$ and the like may be used instead of PZT.

Figure 9B:
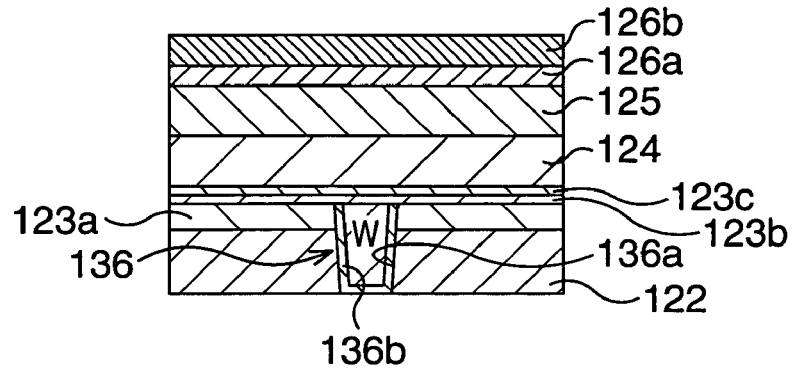

Subsequently, as shown in FIG. 9B, an $IrO_2$ film 126a and an $IrO_x$ film 126b which are constituents of an upper electrode layer 126 are sequentially formed on the capacitor film 125.

In detail, by a sputtering method with the substrate temperature regulated at 100° C. to 300° C., in this case, at 300° C., an iridium oxide which is a conductive oxide is first formed to a film thickness of 30 nm to 70 nm, in this case, about 50 nm. By performing sputter deposition at the substrate temperature, an $IrO_2$ film 126a which is formed by being crystallized into the composition of $IrO_2$ is formed. By the $IrO_2$ film 126a, a favorable interface is formed between the $IrO_x$ film 126b and the capacitor film 125, and excellent ferroelectric characteristics are obtained.

Next, by a sputtering method with the substrate temperature regulated at 20° C. to 100° C., which is a lower temperature than at the time of deposition of the $IrO_2$ film 126a, in this case, at 30° C., an iridium oxide that is a conductive oxide is formed to a film thickness of 50 nm to 200 nm which is thicker than the $IrO_2$ film 126a, in this case, about 100 nm. By performing sputter deposition at this substrate temperature, the $IrO_x$ film 126b in an amorphous state ($IrO_x$: 0<x<2) which is lower in oxidation degree than the $IrO_2$ film 126a is formed. The $IrO_x$ film 126b is formed to be a uniform film excellent in morphology, and therefore, it can suppress degradation of the ferroelectric characteristics.

Figure 9C:
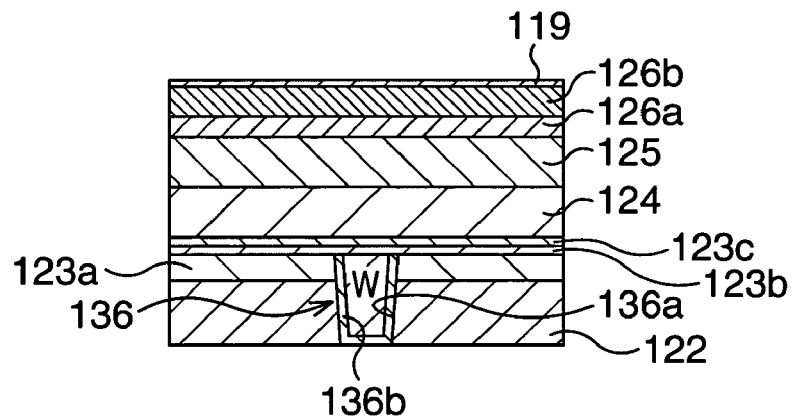

Subsequently, as shown in FIG. 9C, the surface layer of the $IrO_x$ film 126b is subjected to annealing treatment.

In detail, by an RTA treatment at 600° C. to 750° C., in this case, at 725° C. for about one minute under an $O_2$ atmosphere, only the surface layer of the $IrO_x$ film 126b is oxidized, and a highly oxidized layer 119 of a thickness of about 30 nm, which is higher in oxidation degree as compared with the other portion of the $IrO_x$ film 126b, is formed. By the presence of the highly oxidized layer 119 on the surface layer of the $IrO_x$ film 126b, reduction of the $IrO_x$ film 126b is suppressed even if it goes through the subsequent process steps, and is prevented from becoming porous.

Figure 9D:
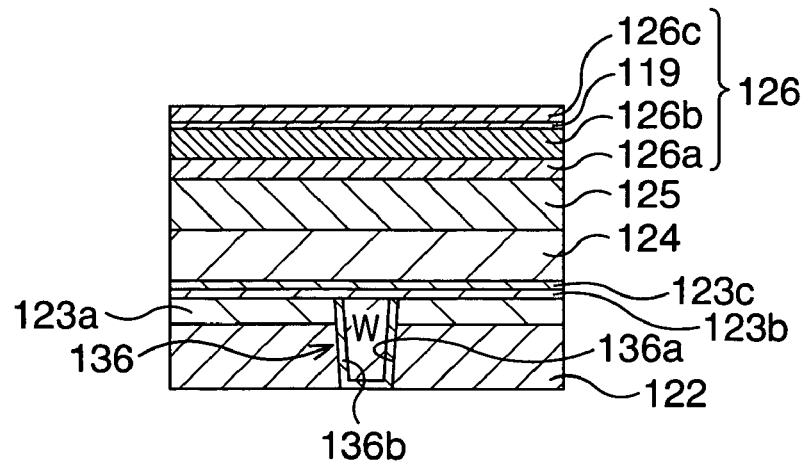

Subsequently, as shown in FIG. 9D, a noble metal film, which functions as a cap film for the $IrO_x$ film 126b, in this case, an Ir film 126c is formed to a film thickness of about 50 nm on the highly oxidized layer 119 by the sputtering method. The upper electrode layer 126 is composed of the $IrO_2$ film 126a, the $IrO_x$ film 126b (including the highly oxidized layer 119 on the surface layer) and the Ir film 126c. It is possible to omit formation of the Ir film 126c.

Figure 10A:
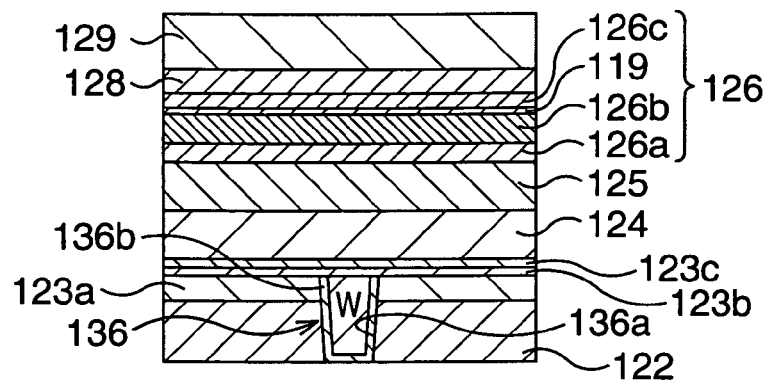
FIGS. 10A to 10D are schematic sectional views showing the construction of the FeRAM according to the second embodiment with its manufacturing method in sequence of the process steps.

Subsequently, as shown in FIG. 10A, a TiN film 128 and a silicon oxide film 129 are formed.

In detail, the TiN film 128 is formed by being deposited on the upper electrode layer 126 to a film thickness of about 200 nm by a sputtering method or the like. The silicon oxide film 129 is formed by being deposited on the TiN film 128 to a film thickness of about 1000 nm by a CVD method using, for example, TEOS. In this case, an HDP film may be formed instead of the TEOS film. It is preferable to form a silicon nitride film further on the silicon oxide film 129.

Figure 10B:
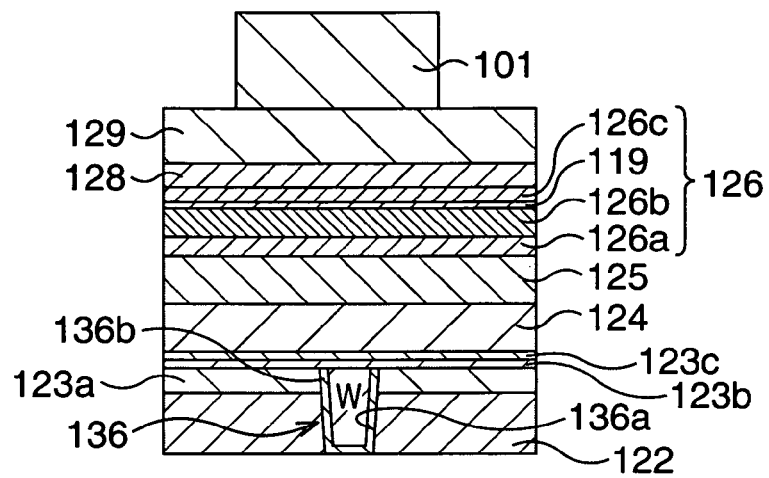

Subsequently, as shown in FIG. 10B, a resist mask 101 is formed.

In detail, a resist is coated on the silicon oxide film 129, the resist is processed into an electrode shape by lithography, and the resist mask 101 is formed.

Figure 10C:
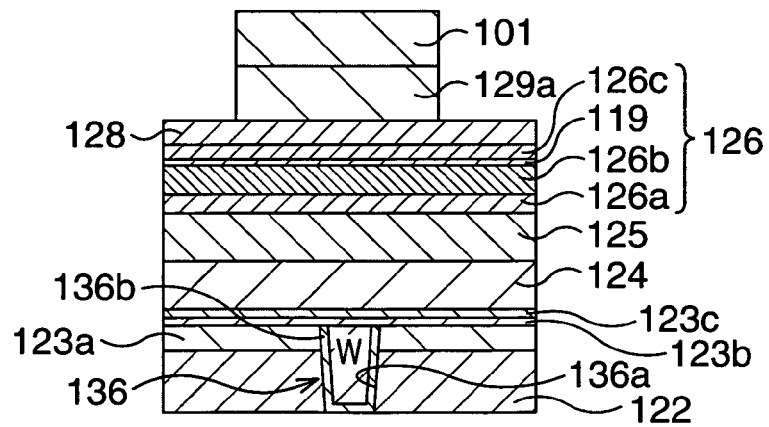

Subsequently, as shown in FIG. 10C, a silicon oxide film 129 is processed.

In detail, the silicon oxide film 129 is dry-etched with the resist mask 101 as a mask. At this time, the silicon oxide film 129 is patterned along the electrode shape of the resist mask 101, and a hard mask 129a is formed. The resist mask 101 is etched and decreases in thickness.

Figure 10D:
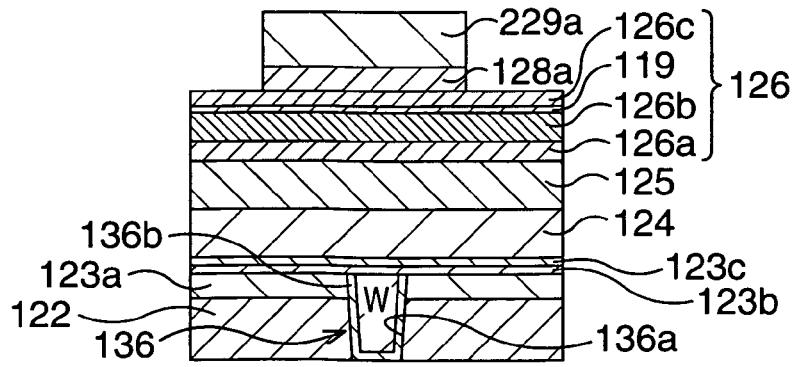

Subsequently, as shown in FIG. 10D, the TiN film 128 is processed.

In detail, with the resist mask 101 and the hard mask 129a as a mask, the TiN film 128 is dry-etched. At this time, the TiN film 128 is patterned along the electrode shape of the hard mask 129a, and a hard mask 128a is formed. The resist mask 101 itself is etched during the etching and becomes thin. Thereafter, the resist mask 101 is removed by ashing treatment or the like.

Figure 11A:
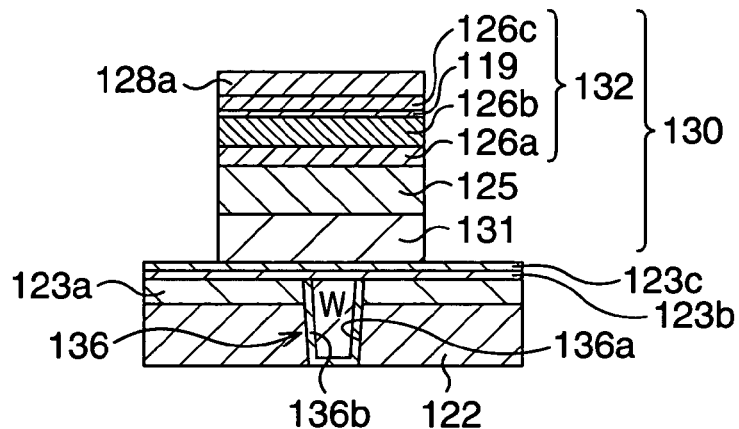
FIGS. 11A to 11C are schematic sectional views showing the construction of the FeRAM according to the second embodiment with its manufacturing method in sequence of the process steps.

Subsequently, as shown in FIG. 11A, the upper electrode layer 126, the capacitor film 125, the lower electrode layer 124, the oxygen barrier film 123c and the orientation property improving film 123b are processed.

In detail, with the hard masks 128a and 129a as a mask, and with the upper insulating film 123a as an etching stopper, the upper electrode layer 126, the capacitor film 125, the lower electrode layer 124, the oxygen barrier film 123c and the orientation property improving film 123b are dry-etched. At this time, the upper electrode layer 126, the capacitor film 125, the lower electrode layer 124, the oxygen barrier film 123c and the orientation property improving film 123b are patterned along the electrode shape of the hard mask 128a. The hard mask 129a itself is etched during the etching and becomes thin. Thereafter, the hard mask 129a is etched and removed by whole-surface dry etching (etchback).

Figure 11B:
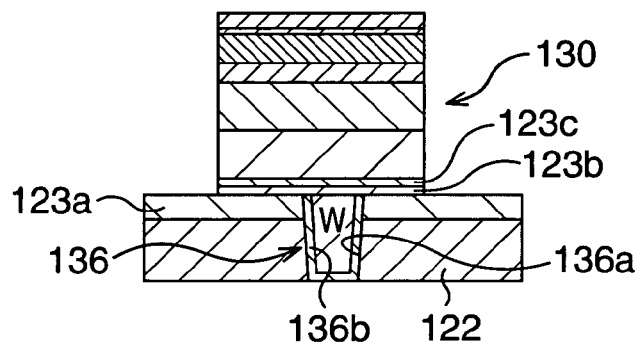

Subsequently, as shown in FIG. 11B, a ferroelectric capacitor structure 130 is completed.

In detail, the hard mask 128a used as the mask is removed by wet etching. At this time, the ferroelectric capacitor structure 130 in which the capacitor film 125 and the upper electrode 132 are sequentially stacked on the lower electrode 131, and the lower electrode 131 and the upper electrode 132 are capacitively coupled via the capacitor film 125 is completed. In this ferroelectric capacitor structure 130, the lower electrode 131 is connected to the plug 136 via the conductive orientation property improving film 123b and the oxygen barrier film 123c, and the source/drain 118 and the lower electrode 131 are electrically connected via the plug 136, the orientation property improving film 123b and the oxygen barrier film 123c.

Figure 11C:
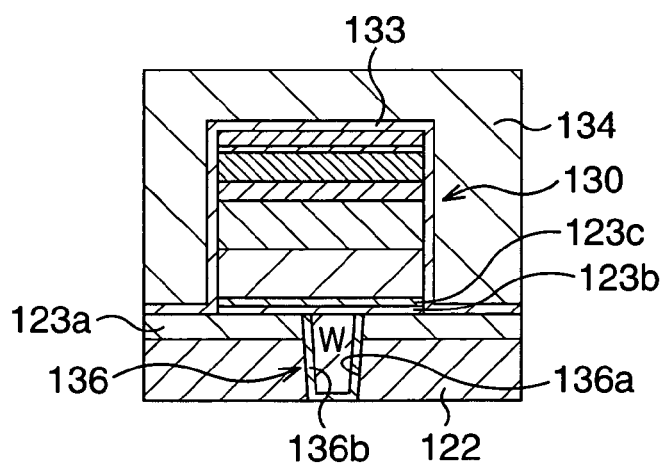

Subsequently, as shown in FIG. 11C, a protection film 133 and an interlayer insulating film 134 are formed.

In detail, alumina ($Al_2O_3$) is used as a material, and is deposited to a film thickness of about 20 nm to 50 nm by a sputtering method to cover the entire surface of the ferroelectric capacitor structure 130, and the protection film 133 is formed. Thereafter, the protection film 133 is subjected to annealing treatment.

Subsequently, the interlayer insulating film 134 is formed so as to cover the ferroelectric capacitor structure 130 via the protection film 133. In this case, the interlayer insulating film 134 is formed by depositing a silicon oxide film to a film thickness of about 1500 nm to 2500 nm by the plasma CVD method using, for example, TEOS, and thereafter, polishing it until the film thickness becomes about 1000 nm, for example, by CMP. After the CMP, plasma annealing treatment of $N_2O$, for example, is performed for the purpose of dehydration of the interlayer insulating film 134.

Figure 12A:
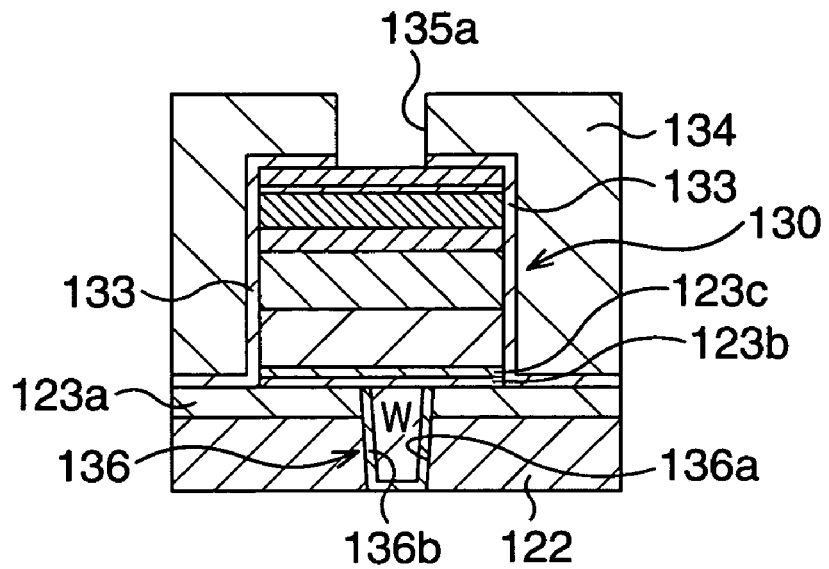
FIGS. 12A and 12B are schematic sectional views showing the construction of the FeRAM according to the second embodiment with its manufacturing method in sequence of the process steps.

Subsequently, as shown in FIG. 12A, a via hole 135a to the upper electrode 132 of the ferroelectric capacitor structure 130 is formed.

In detail, the interlayer insulating film 134 and the protection film 133 are patterned by lithography and subsequent dry etching, the via hole 135a in which a part of the front surface of the upper electrode 132 is exposed is formed.

Figure 12B:
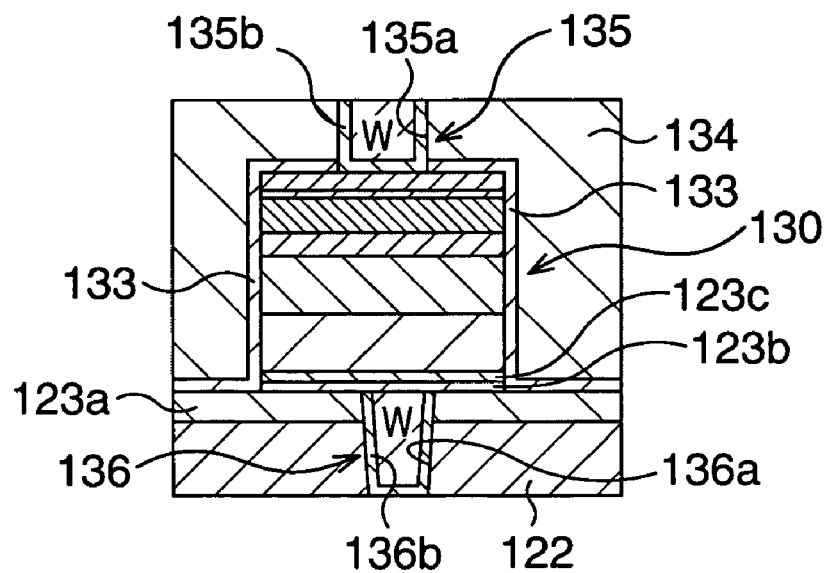

Subsequently, as shown in FIG. 12B, a plug 135 which is connected to the upper electrode 132 of the ferroelectric capacitor structure 130 is formed.

In detail, a base film (glue film) 135b is first formed to cover the wall surface of the via hole 135a, and thereafter, a W film is formed to fill the via hole 135 via the glue film 135b by a CVC method. Then, with the interlayer insulating film 134 as a stopper, for example, the W film and the glue film 135b are polished by CMP, and the plug 135 in which the inside of the via hole 135a is filled with W via the glue film 135b is formed. After the CMP, plasma annealing treatment of $N_2O$, for example, is performed.

Figure 13A:
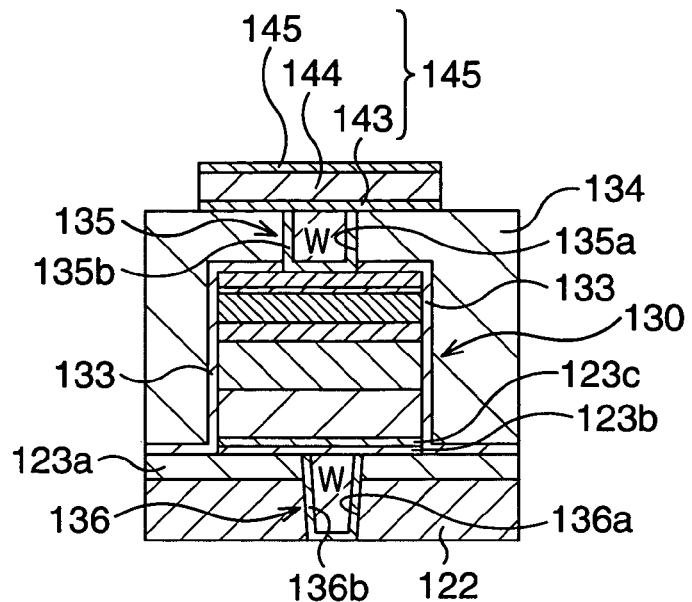
FIGS. 13A and 13B are schematic sectional views showing the construction of the FeRAM according to the second embodiment with its manufacturing method in sequence of the process steps.

Subsequently, as shown in FIG. 13A, a first wiring 145 which is connected to the plug 135 is formed.

In detail, first, a barrier metal film 142, a wiring film 143 and a barrier metal film 144 are deposited on the entire surface on the interlayer insulating film 134 by a sputtering method or the like. As the barrier metal film 142, for example, a Ti film of a film thickness of about 5 nm and a TiN film of a film thickness of about 150 nm are deposited to be stacked by a sputtering method. As the wiring film 143, for example, an Al alloy film (Al—Cu film in this case) is deposited to a film thickness of about 350 nm. As the barrier metal film 144, for example, a Ti film of a film thickness of about 5 nm and a TiN film of a film thickness of about 150 nm are deposited to be stacked by a sputtering method. In this case, the structure of the wiring film 143 is made the same structure as the logic portion of the same rule other than FeRAM, and therefore, there is no problem in processing of the wiring and reliability.

Next, after, for example, an SiON film or an anti-reflection film (not shown) are deposited as an anti-reflection film, the anti-reflection film, the barrier metal film 144, the wiring film 143 and the barrier metal film 142 are processed into the wiring shape by lithography and subsequent dry etching, and the first wiring 145 which is connected to the plug 135 are pattern-formed. As the wiring film 143, a Cu film (or a Cu alloy film) is formed by utilizing a so-called damascene method or the like instead of forming the Al alloy film, and a Cu wiring may be formed as the first wiring 145.

Figure 13B:
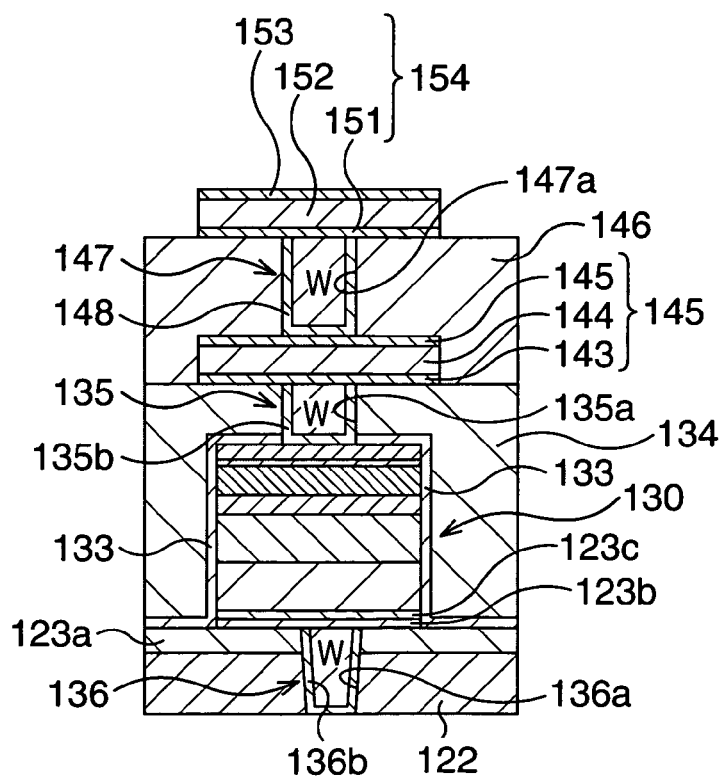

Subsequently, as shown in FIG. 13B, a second wiring 154 which is connected to the first wiring 145 is formed.

In detail, first, an interlayer insulating film 146 is formed to cover the first wiring 145. As the interlayer insulating film 146, a silicon oxide film is deposited to a film thickness of about 700 nm, and a plasma TEOS film is formed to make the film thickness as a whole about 1100 nm, after which, the front surface is polished by CMP to form the film thickness to about 750 nm.

Next, a plug 147 which is connected to the first wiring 145 is formed.

First, a via hole 147a of a diameter of about 0.25 μm, for example, is formed by processing the interlayer insulating film 146 by lithography and the subsequent dry etching until a part of the front surface of the first wiring 145 is exposed. Next, after a base film (glue film) 148 is formed to cover the wall surface of the via hole 147a, a W film is formed to fill the via hole 147a via the glue film 148 by a CVD method. Then, for example, the W film and the glue film 148 are polished with the interlayer insulating film 146 as a stopper, the plug 147 in which the inside of the via hole 147a is filled with the W via the glue film 148 is formed.

Next, the second wiring 154, which is connected to the plug 147, is formed.

First, a barrier metal film 151, a wiring film 152 and a barrier metal film 153 are deposited on the entire surface by a sputtering method or the like. As the barrier metal film 151, for example, a Ti film of a film thickness of about 5 nm and a TiN film of a film thickness of about 150 nm are deposited to be stacked by a sputtering method. As the wiring film 152, for example, an Al alloy film (Al—Cu film in this case) is deposited to a film thickness of about 350 nm. As the barrier metal 153, for example, a Ti film of a film thickness of about 5 nm and a TiN film of a film thickness of about 150 nm are deposited to be stacked by a sputtering method. In this case, the structure of the wiring film 152 is made the same structure as the logic portion of the same rule other than FeRAM, and therefore, there is no problem in processing of the wiring and reliability.

Next, after, for example, an SiON film or an anti-reflection film (not shown) are deposited as an anti-reflection film, the anti-reflection film, the barrier metal film 153, the wiring film 152 and the barrier metal film 151 are processed into the wiring shape by lithography and the subsequent dry etching, and the second wiring 154 is pattern-formed. As the wiring film 152, a Cu film (or a Cu alloy film) is formed by utilizing a so-called damascene method or the like instead of forming the Al alloy film, and a Cu wiring may be formed as the second wiring 154.

Thereafter, the stack type FeRAM according to this embodiment is completed through the various process steps of forming interlayer insulating films, additional upper layer wirings and the like.

As described above, according to this embodiment, though the iridium oxide of the upper electrode 132 of the ferroelectric capacitor structure 130 is made the stacked structure of the IrO$_2$ film 126a and the IrO$_x$ film 126b to prevent characteristics degradation, reduction of the IrO$_x$ film 26b is suppressed to prevent it from becoming porous by forming the highly oxidized layer 119 on the surface layer of the IrO$_x$ film 126b. By this construction, the stack type FeRAM with high reliability which is capable of securing characteristics to a high level can be realized.

Further, in this embodiment, on forming the ferroelectric capacitor structure 130, the hard mask 128a composed of TiN is used for dry etching of the upper electrode layer 126, the capacitor film 125, the lower electrode layer 124, the oxygen barrier film 123c and the orientation property improving film 123b.

When a hard mask composed of TiN is formed on the IrO$_x$ film 126b without forming the highly oxidized layer 119 on the surface layer of the IrO$_x$ film 126b in the prior art, for example, the IrO$_x$ film 126b reduces, and a foreign layer such as a titanium oxide is formed in the interface of the IrO$_x$ film 126b with the hard mask. Thereby, the etching rate of the hard mask becomes high, and the function as the etching mask reduces.

In this embodiment, the highly oxidized layer 119 is formed on the surface layer of the IrO$_x$ film 126b, the Ir film 126c is further formed, and the hard mask 128a composed of IrO$_x$ and TiN for the IrO$_x$ film 126b is formed via the highly oxidized film 119 and the Ir film 126c. By this construction, predetermined dry etching for forming the ferroelectric capacitor structure 130 can be carried out without oxidizing the hard mask 128a.

According to the present invention, even though an iridium oxide is adopted for the material of the upper electrode of the capacitor structure to prevent the characteristics degradation, reduction of the iridium oxide is suppressed to prevent it from becoming porous, and as a result, the semiconductor device with high reliability capable of securing characteristics to a high degree can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate; and
   a capacitor structure formed above said semiconductor substrate, and formed by sandwiching a capacitor film composed of a dielectric material by a lower electrode and an upper electrode,
   wherein the upper electrode has an iridium oxide film,
   wherein the iridium oxide film includes a stacked structure of a first iridium oxide layer crystallized in a composition of IrO$_2$ (iridium dioxide), and a second iridium oxide layer lower in oxidation degree than the first iridium oxide layer, and
   wherein a surface layer of the second iridium oxide layer is made a highly oxidized layer higher in oxidation degree of iridium than a portion directly below the surface layer.

2. The semiconductor device according to claim 1, wherein the highly oxidized layer is crystallized in a composition of IrO$_2$ (iridium dioxide).

3. The semiconductor device according to claim 1, wherein the upper electrode has an iridium film on the iridium oxide film.

4. The semiconductor device according to claim 1, wherein the capacitor film is formed from a ferroelectric material.

5. The semiconductor device according to claim 1, wherein said capacitor structure is a stack type which is electrically connected below the lower electrode and above the upper electrode, respectively.

6. The semiconductor device according to claim 1, wherein said capacitor structure is a planar type which is electrically connected above the lower electrode and above the upper electrode, respectively.

* * * * *